United States Patent [19]

Hermann

[11] Patent Number: 4,503,353
[45] Date of Patent: Mar. 5, 1985

[54] CUT ANGLES FOR TUNING FORK TYPE QUARTZ RESONATORS

[75] Inventor: Jean Hermann, Neuchatel, Switzerland

[73] Assignee: Centre Electronique Horloger S.A., Neuchatel, Switzerland

[21] Appl. No.: 512,526

[22] Filed: Jul. 11, 1983

[30] Foreign Application Priority Data

Jul. 14, 1982 [CH] Switzerland ............... 4277/82

[51] Int. Cl.$^3$ ............................................. H01L 41/08
[52] U.S. Cl. ................................. 310/361; 310/370; 310/333
[58] Field of Search ............... 310/360, 361, 370, 333

[56] References Cited

U.S. PATENT DOCUMENTS 4,126,802 11/1978 Hermann ........................ 310/361
4,320,320 3/1982 Momosaki et al. ............. 310/361

FOREIGN PATENT DOCUMENTS 0023672 2/1980 Japan ............................... 310/361
2006520 5/1979 United Kingdom ............ 310/361

Primary Examiner—Mark O. Budd
Attorney, Agent, or Firm—Parkhurst & Oliff

[57] ABSTRACT

Axes $X'$, $Y'$ and $Z'$ of a resonator are established from the axes X, Y and Z of a quartz crystal by virtue of two rotational movements through angles $\phi$ and $\theta$, respectively. The resonator is energized to vibrate in accordance with the fundamental torsional mode. The angles of cut $\phi$ and $\theta$ are such that the first-order temperature coefficient is zero. The torsional mode may be coupled to a flexural mode in order to render the second-order temperature coefficient zero. The fork tines extend in the $X'$ direction. In other embodiments the tines extend in the $Y'$ direction and the rotation $\phi$ and $\theta$ are about the X and $Z'$ axes, respectively.

14 Claims, 5 Drawing Figures

CUT ANGLES FOR TUNING FORK TYPE QUARTZ RESONATORS

BACKGROUND

The present invention concerns quartz resonators and relates more particularly to resonators of the tuning fork type, which can be used in timepieces.

The relatively low frequency of a quartz fork, its good shock resistance, its mode of manufacture, and the way in which it is fitted, which can be closely controlled, explain why it is the resonator that is currently most widely used in timepieces. The increasing demand for a higher degree of accuracy has caused manufacturers to seek to improve the levels of performance thereof, and, in particular, to improve its thermal properties. W. P. Mason, in an article entitled "A New Quartz-Crystal Plate", presented in January 1940 in "Bell Telephone System Technical Publications", showed how the thermal properties of a resonator could be influenced by coupling a number of modes of vibration. More recently, two applications of that principle to tuning fork arrangements have been disclosed, by Suwa Seikosha Co., Ltd., at the 33rd and 34th "Annual Frequency Control Symposia" in 1979 and 1980, respectively. The first presentaton, by E. Monosaki et al, entitled "New Quartz Tuning Fork With Very Low Temperature Coefficient", concerns a tuning fork which vibrates in accordance with the fundamental flexural mode and in which the first-order and second-order temperature coefficients are nullified, by virtue of coupling to the fundamental torsional mode. The second presentation, by S. Kogure et al, entitled "New Type Twin Mode Resonator" also concerns a tuning fork which vibrates in the flexural mode, but on the first harmonic, and which makes use of coupling to the fundamental torsional mode. In both cases, the coupling effect is used to modify the thermal properties of a tuning fork which vibrates in the flexural mode and in which the frequency vs. temperature curve, which is initially parabolic, is converted into a cubic curve. The major disadvantage of those prior designs is that the coupling effect envisaged considerably increases the dispersion of the first-order temperature coefficient which must therefore be the subject of an individul adjustment operation, thereby increasing the manufacturing cost of such a resonator. Moreover, the angles of cut and the vibration mode selected are such that, without the coupling effect, the first-order temperature coefficient is of a high value, the effect of the coupling influencing both the first-order coefficient and the second-order coefficient.

SUMMARY OF THE INVENTION

An object of the present invention is a piezoelectric resonator of the tuning fork type in which the frequency remains virtually constant over a wide temperature range and which does not necessitate any adjustment in respect of its thermal properties.

Another object of the invention is a piezoelectric resonator in which the first-order temperature coefficient is substantially zero and the second-order temperature coefficient is low.

Another object of the invention is a piezoelectric resonator in which the first-order and second-order temperature coefficients are substantially zero.

Yet another object of the invention is a resonator which is adapted to be produced by photolithographic processes.

The resonator according to the present invention is produced in a quartz plate having axes X', Y' and Z' and angles of cut $\phi$ and $\theta$ such that the axes X', Y' and Z' are produced from the electric axis X, the mechanical axis Y and the optical axis Z of the quartz crystal, by means of a first rotation through an angle $\phi$ about an axis Y and a second rotation through an angle $\theta$ about the axis Z', the resonator being characterized in that it vibrates in accordance with the fundamental torsional mode and the angles of cut $\phi$ and $\theta$ are selected so that tthe first-order temperature coefficient is substantially zero.

In an alternative embodiment, the first rotation is through the angle $\phi$ about the axis X and the second rotation is through the angle $\theta$ about the axis Z', the resonator being characterized in that the tines of the tuning fork are parallel to the axis X' of the plate, and it vibrates in accordance with the fundamental torsional mode and the angles of cut $\phi$ and $\theta$ are selected so that the first-order temperature coefficient is substantially zero.

The use of a torsional vibration mode makes it possible to find angles of cut $\phi$ and $\theta$ such that the first-order temperature coefficient is zero. In that case, the second-order temperature coefficient is low and it is possible to make that coefficient zero by using coupling with a flexural mode, without the coupling effect influencing the first-order coefficient. Thus, in accordance with a further feature of the invention, the geometric dimensions of the resonator are selected so that the fundamental torsional mode is coupled to a flexural vibration mode such that the second-order temperature coefficient is substantially zero.

BRIEF DESCRIPTION OF THE DRAWINGS

The invention will be described in more detail, by way of example, with reference to the accompanying drawings, in which.

DETAILED DESCRIPTION

Figure 1:
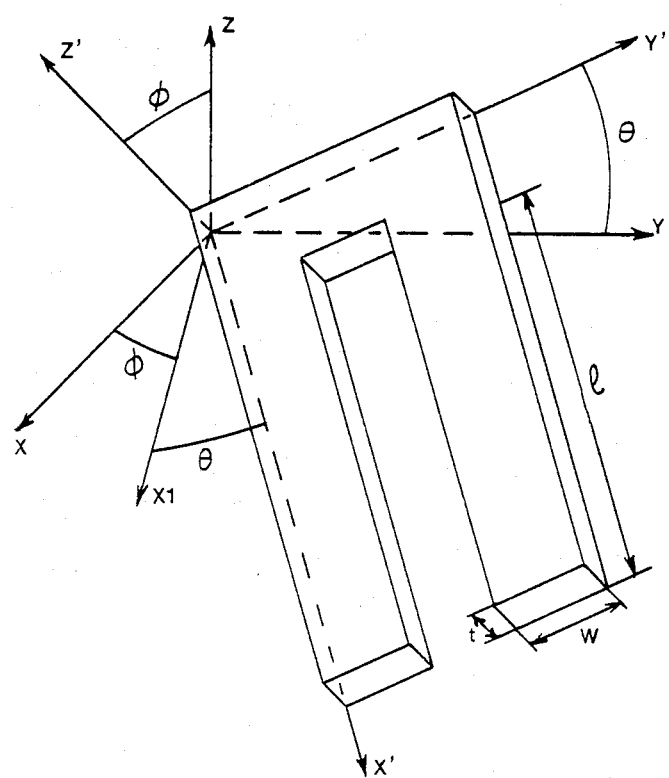
FIG. 1 shows a perspective view of a first embodiment of the invention.

FIG. 1 shows a perspective view of a first embodiment of a resonator according to the invention, which shows the angles of cut and the positioning of the resonator with respect to the axes of the crystal. Taking a quartz crystal in which the electrical, mechanical and optical axes are respectively the axes X, Y and Z, a base plate is obtained, after a first rotation through an angle $\phi$ about the axis Y, followed by a second rotation through an angle $\theta$ about the axis Z'. In the newly established system of axes X', Y' and Z', the tuning fork is disposed so that the length l thereof is directed along the axis X', the width w thereof is directed along the axis Y' and the thickness t thereof is directed along the axis Z'.

In a preferred embodiment, the angles $\phi$ are 59° and 49° respectively. Those angles are selected so that, for vibration of the resonator in accordance with the fundamental torsional mode, the first-order temperature coefficient is substantially zero. The second-order temperature coefficient can also be made zero by adjusting the thickness t of the resonator to produce coupling of the fundamental torsional mode with the first flexural harmonic. With the angles of cut as defined above, coupling does not have any perceptible effect on the first-order temperature coefficient, but, conversely, does have a substantial effect on the second-order temperature coefficient. In comparison with conventional tuning forks which vibrate in accordance with a non-coupled flexural mode, the tuning fork according to the present invention enjoys improved thermal performance, its frequency vs. temperature curve being of the cubic type, whereas it is of the quadratic type in conventional tuning forks. While the thickness t of the resonator is defined by the strength of the coupling effect necessary to make the second-order temperature coefficient zero, the other dimensions, namely the length l and the width w of the tines are such as to provide an acceptable compromise between the frequency and the dimensions of the resonator. For example, a timekeeping resonator, which can be encapsulated in a cylindrical case measuring 2 mm in diameter and 6 mm in length, could be produced with a vibration frequency of the order of 260 kHz.

Figure 4:
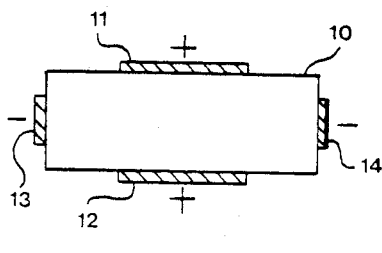
FIG. 4 shows the configuration of the electrodes for the resonators of FIGS. 1 and 2.

FIG. 4 shows a cross-sectional view of one of the tines of the tuning fork and illustrates the configuration of the electrodes required to cause the resonator in FIG. 1 to vibrate in accordance with the fundamental torsional mode. The four faces of the tine 10 bear metallized portions 11 to 14 which act as electrodes. The electrodes 11 and 12, or 13 and 14, on two opposite faces are of the same polarity, while the electrodes on two adjacent faces are of opposite polarities. The electrodes on the other tine of the tuning fork are of an identical configuration but are opposite in polarity. The electrodes, as well as the connections between electrodes or between the electrodes and the output terminals of the resonator, are made by known methods.

Figure 2:
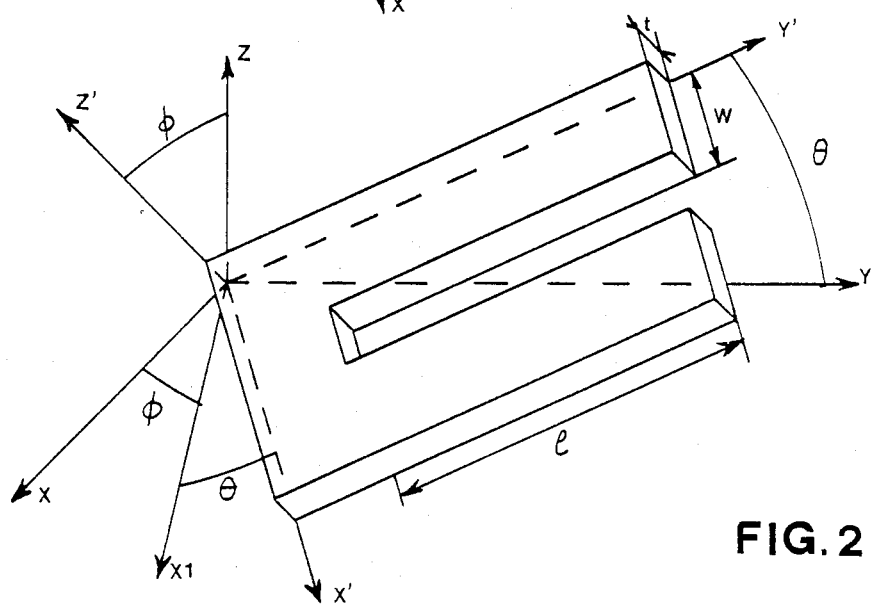
FIG. 2 shows a perspective view of another embodiment of the invention.

FIG. 2 shows an alternative embodiment of the resonator in FIG. 1, wherein the tines of the tuning fork are parallel to the axis Y'. As in the construction shown in FIG. 1, the axes X', Y' and Z' are established from the axes X, Y and Z of the crystal, by means of two rotational movements, the first about the axis Y, through an angle $\phi$, and the second about the axis Z', through the angle $\theta$. The angles of cut $\phi$ and $\theta$ are such that: $50° < \phi 70°$ and $40° < \theta 65°$. In accordance with a first advantageous embodiment, the angles $\phi$ and $\theta$ are 60° and 50.5° respectively, while in a second advantageous embodiment, the angles $\phi$ and $\theta$ are 61° and 57.5° respectivly. All the information set out above in relation to the embodiment shown in FIG. 1 also applies to the embodiment shown in FIG. 2. In particular, the same electrode configuration (see FIG. 4) is used to cause the resonator to vibrate in accordance with the fundamental torsional mode. The second-order thermal coefficient can be rendered zero by using coupling of the fundamental torsional mode with the first flexural harmonic, by virtue of suitable selection of the thickness of the tuning fork. The coupling effect influences only the second-order temperature coefficient, the first-order temperature coefficient being virtually zero with the above-defined angles of cut.

Figure 3:
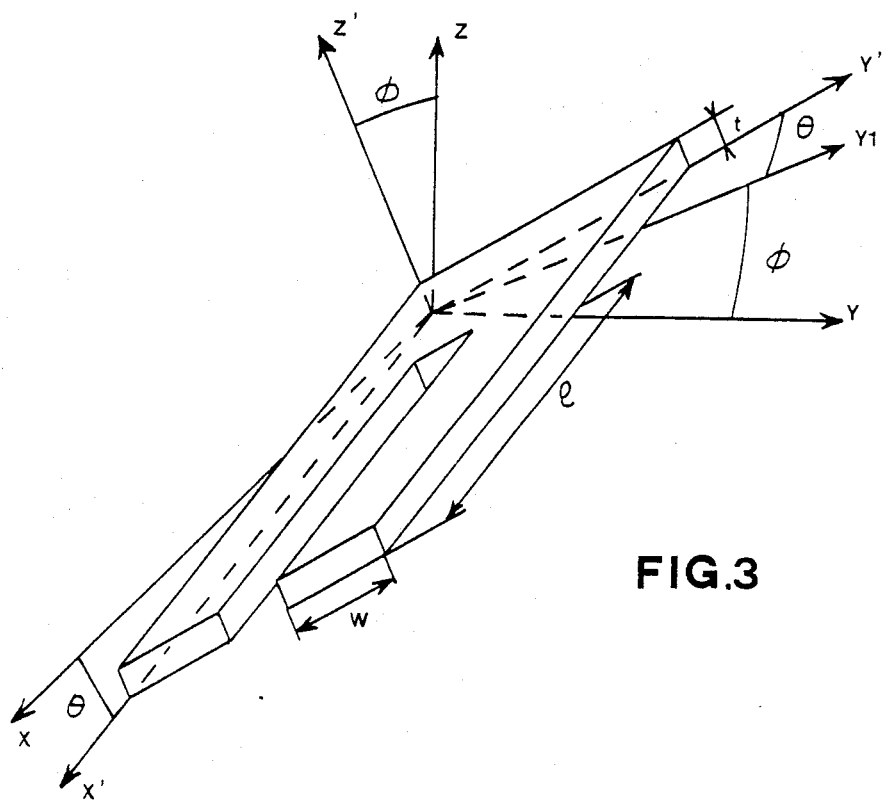
FIG. 3 shows a perspective view of another embodiment of the invention.
Figure 5:
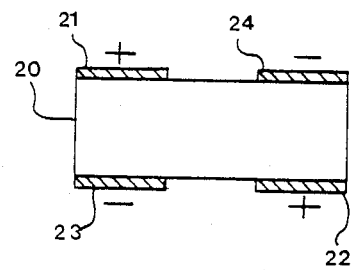
FIG. 5 shows the configuration of the electrodes for the resonator of FIG. 3.

FIG. 3 shows another embodiment of the invention. As illustrated in FIG. 3, the axes X', Y' and Z' are established from the axes X, Y and Z of the crystal by means of two rotational movements: one through an angle $\phi$ about the axis X, and the other through an angle $\theta$ about the axis Z'. The tuning fork is disposed so that the tines thereof are parallel to the axis X'. In accordance with a first advantageous construction, the angles of cut $\phi$ and $\theta$ are $-45.5°$ and $\pm 45°$ respectively, while in a second alternative construction, those angles are 64.5° and $\pm 45°$. The FIG. 3 embodiment is energized to vibrate in accordance with the fundamental torsional mode, and it has a first-order temperature coefficient which is substantially zero, and a very low second-order coefficient. The configuration of the electrodes required to cause such a resonator to vibrate in the torsional mode is shown in FIG. 5. Only two faces of each tine 20 have to be metallized. Each of the two faces bears two electrodes 21 and 24, or 22 and 23, which are of opposite polarities, and the corresponding electrodes of the two faces, such as 21 and 23, or 22 and 24, are also opposite in polarity. The electrodes of the other tine of the tuning fork are of an identicl configuration, but their polarity at any time is opposite to that of the corresponding electrodes of the first tine.

The thermal behavior of the resonator of FIG. 3 may also be improved by using coupling of the fundamental torsional mode with a flexural fundamental or flexural harmonic. In this case, the coupling effect influences not only the second-order temperature coefficient, but also the first-order temperature coefficient, though to a minor extent. The angles of cut $\phi$ and $\theta$ should be:

$$-45° < \theta < -38° \text{ and } \theta = \pm 45°,$$

or $$40° < \phi < 80° \text{ and } \theta = \pm 45°$$

As set above, the coupling factor between both vibrational modes will be defined by adjusting the geometrical dimensions of the resonator so that both the first-order and second-order temperature coefficients will be low.

The various alternative forms of the invention as described above have attractive thermal properties and do not require any individual adjustment. They can therefore be produced at a highly advantageous cost, for example by using photolithographic etching processes.

Although the present invention is described with reference to particular embodiments, it will be clear that it is not limited to such embodiments and that it may be the subject of modifications and variations within the scope of the following claims.

What is claimed is:

1. A piezoelectric resonator of the tuning fork type having two tines, said resonator comprising a quartz crystal plate having axes X', Y' and Z' and angles of cut $\phi$ and $\theta$ such that the axes X', Y' and Z' are established from the electrical axis X, the mechanical axis Y and the optical axis Z of the quartz crystal by means of first rotation through an angle $\phi$ about the axis Y, and a second rotation through an angle $\theta$ about the axis Z', said resonator vibrating in accordance with the fundamental torsional mode, the angles of cut $\phi$ and $\theta$ being selected so that the first-order temperature coefficient is substantially zero, the tines of the tuning fork being parallel to the axis X' of the quartz plate and the angles of cut $\phi$ and $\theta$ being such that:

$50° < \phi < 70°$ and $40° < \theta < 65°$.

2. The resonator of claim 1, wherein said angles of cut $\phi$ and $\theta$ are:

$\phi = 59°$ and $\theta = 49°$.

3. A piezoelectric resonator of the tuning fork type having two tines, the resonator comprising a quartz crystal plate having axes X', Y' and Z' and angles of cut $\phi$ and $\theta$ such that the axes X', Y' and Z' are established from the electrical axis X, the mechanical axis Y and the optical axis Z of the quartz crystal by means of a first rotation through an angle $\phi$ about the axis Y, and a second rotation through an angle $\theta$ about the axis Z', said resonator vibrating in accordance with the fundamental torsional mode, the angles of cut $\phi$ and $\theta$ being selected so that the first-order temperature coefficient is substantially zero, the geometrical dimensions of the resonator being selected so that the fundamental torsional mode is coupled to a flexural vibration mode, whereby the second-order temperature coefficient is substantially zero, the tines of the tuning fork being parallel to the axis X' of the quartz plate and the angles of cut $\phi$ and $\theta$ being such that:

$50° < \phi < 70°$ and $40° < \theta < 65°$.

4. The resonator of claim 3, wherein said angles of cut $\phi$ and $\theta$ are:

$\phi = 59°$ and $\theta = 49°$.

5. A piezoelectric resonator of the tuning fork type having two tines, the resonator comprising a quartz crystal plate having axes X', Y' and Z' and angles of cut $\phi$ and $\theta$ such that the axes X', Y' and Z' are established from the electrical axis X, the mechanicl axis Y and the optical axis Z of the quartz crystal by means of a first rotation through an angle $\phi$ about the axis Y, and a second rotation through an angle $\theta$ about the axis Z', said resonator vibrator vibrating in accordance with the fundamental torsional mode, the angles of cut $\phi$ and $\theta$ being selected so that the first-order temperature coefficient is substantially zero, the tines of the tuning fork being parallel to the axis Y' of the quartz plate and the angles of cut $\phi$ and $\theta$ being such that:

$50° < \phi < 70°$ and $40° < \theta < 70°$.

6. The resonator of claim 5, wherein the angles of cut $\phi$ and $\theta$ are:

$\phi = 60°$ and $\theta = 50.5°$.

7. The resonator of claim 5, wherein the angles of cut $\phi$ and $\theta$ are:

$\phi = 61°$ and $\theta = 57.5°$.

8. A piezoelectric resonator of the tuning fork type having two tines, the resonator comprising a quartz crystal plate having axes X', Y' and Z' and angles of cut $\phi$ and $\theta$ such that the axes X', Y' and Z' are established from the elecrical axis X, the mechanical axis Y and the optical axis Z of the quartz crystal by means of a first rotation through an angle $\phi$ about the axis Y, and a second rotation through an angle $\theta$ about the axis Z', said resonator vibrating in accordance with the fundamental torsional mode, the angles of cut $\phi$ and $\theta$ being selected so that the first-order temperature coefficient is substantially zero, the geometrical dimensions of the resonator being selected so that the fundamental torsional mode is coupled to a flexural vibration mode, whereby the second-order temprature coefficient is substantially zero, the tines of the tuning fork being parallel to the axis X' of the quartz plate and the angles of cut $\phi$ and $\theta$ being such that:

$50° < \phi < 70°$ and $40° < \theta < 70°$.

9. The resonator of claim 8, wherein the angles of cut $\phi$ and $\theta$ are:

$\phi = 60°$ and $\theta = 50.5°$.

10. The resonator of claim 8, wherein the angles of cut $\phi$ and $\theta$ are:

$\phi = 61°$ and $\theta = 57.5°$.

11. A piezoelectric resonator of the tuning fork type having two tines, the resonator comprising a quartz crystal plate having axes X', Y' and Z' and angles of cut $\phi$ and $\theta$ such that the axes X', Y' and Z' are established from the electrical axis X, the mechanical axis Y and the optical axis Z of the quartz crystal, by means of a first rotation through an angle $\phi$ about the axis X, and a second rotation through an angle $\theta$ about the axis Z', said tines of the tuning fork being parallel to the axis X' of the plate, the tuning fork vibrating in accordance with the fundamental torsional mode, the angles of cut $\phi$ and $\theta$ being selected so that the first-order temperature coefficient is substantially zero, and the angles of cut $\phi$ and $\theta$ being such that:

$-50° < \phi < -32°$ and $\theta = \pm 45°$.

12. A piezoelectric resonator of the tuning fork type having two tines, the resonator comprising quartz crystal plate having axes X', Y' and Z' and angles of cut $\phi$ and $\theta$ such that the axes X', Y' and Z' are established from the electrical axis X, the mechanical axis Y and the optical axis Z of the quartz crystal by means of a first rotation through an angle $\phi$ about the axis X, and a second rotaion through an angle $\theta$ about the axis Z', said tines of the tuning fork being parallel to the axis X' of the plate, the tuning fork vibrating in accordance with the fundamental torsional mode, the angles of cut $\phi$ and $\theta$ being selected so that the first-order temperature coefficient is substantially zero, the geometrical dimensions of the resonator being selected so that the fundamental torsional mode is coupled to a flexural vibration mode, whereby the first-order and second-order temperature coefficients are substantially zero, and the angles of cut $\phi$ and $\theta$ being such that:

$-50° < \phi < -32°$ and $\theta = \pm 45°$.

13. A piezoelectric resonator of the tuning fork type having two tines, the resonator comprising a quartz crystal plate hving axes X', Y' and Z' and angles of cut $\phi$ and $\theta$ such that the axes X', Y' and Z' are established from the electrical axis X, the mechanical axis Y and the optical axis Z of the quartz crystal by means of a first rotation through an angle $\phi$ about the axis X, and a second rotation through an angle $\theta$ about the axis Z', said tines of the tuning fork being parallel to the axis X′ of the plate, the tuning fork vibrating in accordance with the fundamental torsional mode, the angles of cut $\phi$ and $\theta$ being selected so that the first-order temperature coefficient is substantially zero, and the angles of cut $\phi$ and $\theta$ being such that:

$$40° < \phi < 80° \text{ and } \theta = \pm 45°.$$

14. A piezoelectric resonator of the tuning fork type having two tines, the resonator comprising a quartz crystal plate having axes X′, Y′ and Z′ such that the axes X′, Y′ and Z′ are established from the electrical axis X, the mechanicl axis Y and the optical axis Z of the quartz crystal by means of a first rotaion through an angle $\phi$ about the axis X, and a second rotation through an angle $\theta$ about the axis Z′, said tines of the tuning fork being parallel to the axis X′ of the plate, the tuning fork vibrating in accordance with the fundamental torsional mode, the angles of cut $\phi$ and $\theta$ being selected so that the first-order temperature coefficient is substantially zero, the geometrical dimensions of the resonator being selected so that the fundamental torsional mode is coupled to a flexural vibration mode, whereby the first-order and second-order temperature coefficients are substantially zero, and the angles of cut $\phi$ and $\theta$ being such that:

$$40° < \phi < 80° \text{ and } \theta = \pm 45°.$$

* * * * *